United States Patent

Tanaka et al.

(10) Patent No.: US 6,734,456 B2
(45) Date of Patent: May 11, 2004

(54) FERROELECTRIC FILM AND SEMICONDUCTOR DEVICE

(75) Inventors: Keisuke Tanaka, Kyoto (JP); Toru Nasu, Kyoto (JP); Masamichi Azuma, Shiga (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/287,824

(22) Filed: Nov. 5, 2002

(65) Prior Publication Data

US 2003/0151078 A1 Aug. 14, 2003

(30) Foreign Application Priority Data

Nov. 15, 2001 (JP) ........................ 2001-350078
Nov. 15, 2001 (JP) ........................ 2001-350089

(51) Int. Cl.$^7$ .................. H01L 29/76; H01L 31/062; H01L 31/113
(52) U.S. Cl. .................. 257/40; 257/642; 257/295; 257/759
(58) Field of Search ............... 257/295, 310, 257/642, 759, 795, 40

(56) References Cited

U.S. PATENT DOCUMENTS

| | | | |
|---|---|---|---|
| 5,624,707 A | 4/1997 | Azuma et al. | |
| 5,955,754 A | 9/1999 | Azuma et al. | |
| 6,281,534 B1 | 8/2001 | Arita et al. | |
| 6,323,512 B1 * | 11/2001 | Noh et al. | 257/295 |
| 6,489,645 B1 * | 12/2002 | Uchiyama | 257/295 |

FOREIGN PATENT DOCUMENTS

JP  2000-260960 A  9/2000

* cited by examiner

Primary Examiner—Minhloan Tran
Assistant Examiner—Thomas L Dickey
(74) Attorney, Agent, or Firm—McDermott, Will & Emery

(57) ABSTRACT

The ferroelectric film of the invention is made from a ferroelectric material represented by a general formula, $Bi_{4-x+y}A_xTi_3O_{12}$ or $(Bi_{4-x+y}A_xTi_3O_{12})_z+(DBi_2E_2O_9)_{1-z}$, wherein A is an element selected from the group consisting of La, Pr, Nd, Sm, Eu, Gd, Tb, Dy, Ho, Er, Tm, Yb, Lu and V; D is an element selected from the group consisting of Sr, Ba, Ca, Bi, Cd, Pb and La; E is an element selected from the group consisting of Ti, Ta, Hf, W, Nb, Zr and Cr; and $0 \leq x \leq 2$, $0 < y \leq (4-x) \times 0.1$ and $0.5 < z < 1$.

13 Claims, 9 Drawing Sheets

FERROELECTRIC FILM AND SEMICONDUCTOR DEVICE

BACKGROUND OF THE INVENTION

The present invention relates to a ferroelectric film and a semiconductor device including the ferroelectric film.

Ferroelectric films have been widely used in a variety of semiconductor devices, such as a ferroelectric capacitor having first and second electrodes formed on respective faces of a ferroelectric film, an MFS transistor having an MFS (Metal/Ferroelectric/Semiconductor) multilayer structure, an MFIS transistor having an MFIS (Metal/Ferroelectric/Insulator/Semiconductor) multilayer structure and an MFMIS transistor having an MFMIS (Metal/Ferroelectric/Metal/Insulator/Semiconductor) multilayer structure.

Known ferroelectric materials used for forming a ferroelectric film are a PZT ($PbZr_xTi_{1-x}O_3$)-based ferroelectric material and a Bi-based ferroelectric material such as SBT ($SrBi_2Ta_2O_9$) or BTO ($Bi_4Ti_3O_{12}$), and a BTO-based ferroelectric material is regarded as a promising material because it can exhibit a good ferroelectric characteristic.

In particular, as disclosed in, for example, Japanese Laid-Open Patent Publication No. 2000-260960, a ferroelectric material obtained by substituting a nonvolatile element A for part of Bi of $Bi_4Ti_3O_{12}$ and represented by a general formula, $Bi_{4-x}A_xTi_3O_{12}$ (wherein A is selected from the group consisting of La, Pr, Nd, Sm, Eu, Gd, Tb, Dy, Ho, Er, Tm, Yb and Lu; and 0<x<2.8) has been recently proposed.

Japanese Laid-Open Patent Publication No. 2000-260960 describes that a ferroelectric film can be obtained by sintering a film made from the ferroelectric material represented by the general formula, $Bi_{4-x}A_xTi_3O_{12}$ in an oxygen atmosphere for approximately 1 hour at a temperature of approximately 700° C.

The present inventors have found, however, that when a film made from the ferroelectric material represented by the general formula, $Bi_{4-x}A_xTi_3O_{12}$ is sintered in an oxygen atmosphere at approximately 700° C., the resultant ferroelectric film has a problem in its reliability although its initial characteristic is good. Specifically, the present inventors have found that when a semiconductor device including the ferroelectric film represented by the general formula, $Bi_{4-x}A_xTi_3O_{12}$ is operated for approximately 10 years or is made to repeatedly perform a rewrite operation at a temperature of 85° C. or more, the ferroelectric film cannot keep its polarization characteristic.

Furthermore, in order to realize a high degree of integration of a semiconductor device including a ferroelectric film, both compactness and a low-voltage operating characteristic are required. A ferroelectric film made from the ferroelectric material represented by the general formula, $Bi_{4-x}A_xTi_3O_{12}$ has, however, a problem in the low-voltage operating characteristic. Therefore, a semiconductor device including a ferroelectric film made from the ferroelectric material represented by the general formula, $Bi_{4-x}A_xTi_3O_{12}$ is disadvantageous in operating at a low voltage and realizing a high degree of integration.

SUMMARY OF THE INVENTION

In consideration of the aforementioned conventional disadvantages, an object of the invention is improving the reliability and the low-voltage operating characteristic of a ferroelectric film made from a ferroelectric material represented by a general formula, $Bi_{4-x}A_xTi_3O_{12}$.

The first finding based on which the present invention was devised is as follows:

The present inventors have examined the reason why a ferroelectric film represented by the general formula, $Bi_{4-x}A_xTi_3O_{12}$ is degraded in its polarization characteristic when a semiconductor device including the ferroelectric film is operated for approximately 10 years or is made to repeatedly perform a rewrite operation at a temperature of 85° C. or more. As a result, it has been found that the polarization characteristic is degraded because Bi escapes from the crystal structure with the elapse of time.

The second finding is as follows:

The present inventors have examined the reason why a ferroelectric film represented by the general formula, $Bi_{4-x}A_xTi_3O_{12}$ is difficult to operate at a low voltage. As a result, it has been found that a ferroelectric film can be operated at a low voltage by reducing an interatomic distance between Ti and O in the crystal structure. Specifically, when the interatomic distance between Ti and O is large, large energy, that is, a high voltage, is necessary for moving O to cause polarization, but when the interatomic distance between Ti and O is small, energy, namely, a voltage, necessary for moving O to cause polarization is small, and therefore, the ferroelectric film can be thus operated at a low voltage.

The first aspect of the invention is on the basis of the first finding, and Bi is excessively included in a ferroelectric material represented by the general formula, $Bi_{4-x}A_xTi_3O_{12}$.

Specifically, the first ferroelectric film of the invention is made from a ferroelectric material represented by a general formula (1), $Bi_{4-x+y}A_xTi_3O_{12}$, wherein A is an element selected from the group consisting of La, Pr, Nd, Sm, Eu, Gd, Tb, Dy, Ho, Er, Tm, Yb, Lu and V; and 0≦x≦2 and 0<y≦(4−x)×0.1.

In the first ferroelectric film of the invention, since Bi is included by an excessive amount corresponding to a composition ratio y (y>0) of the general formula (1), even though Bi escapes from the crystal structure with the elapse of time, the excessive Bi enters a portion from which Bi has escaped, and therefore, the characteristic of the ferroelectric film is never degraded. Also, the Bi excessive content y satisfies a relationship of y≦(4−x)×0.1, a leakage current flowing due to deposition of bismuth on the ferroelectric film can be prevented. Accordingly, the reliability of the ferroelectric film can be improved.

Preferably, in the first ferroelectric film of the invention, (4−x)×0.02≦y≦(4−x)×0.06 in the general formula (1).

Thus, the initial polarization value of the ferroelectric film can be 20 $\mu C/cm^2$ or more, and hence, the reliability of the ferroelectric film can be improved.

Preferably, in the first ferroelectric film of the invention, A is La and 0.65≦x≦0.85 in the general formula (1).

Thus, the initial polarization value of the ferroelectric film can be 20 $\mu C/cm^2$ or more, and hence, the reliability of the ferroelectric film can be improved.

The second aspect of the invention is on the basis of the second finding. Specifically, the second ferroelectric film of the invention is made from a ferroelectric material represented by a general formula (2), $(Bi_{4-x+y}A_xTi_3O_{12})_z + (DBi_2E_2O_9)_{1-z}$, wherein A is an element selected from the group consisting of La, Pr, Nd, Sm, Eu, Gd, Tb, Dy, Ho, Er, Tm, Yb, Lu and V; D is an element selected from the group consisting of Sr, Ba, Ca, Bi, Cd, Pd and La; E is an element selected from the group consisting of Ti, Ta, Hf, W, Nb, Zr and Cr; and 0≦x≦2, 0<y≦(4−x)×0.1 and 0.5<z<1.

In the second ferroelectric film of the invention, since Bi is included by an excessive amount corresponding to a composition ratio y (y>0) of the general formula (2), even though Bi escapes from the crystal structure with the elapse of time, the excessive Bi enters a portion from which Bi has escaped, and therefore, the characteristic of the ferroelectric film is never degraded. Also, the Bi excessive content y satisfies a relationship of y≦(4−x)×0.1, a leakage current flowing due to deposition of bismuth on the ferroelectric film can be prevented. Accordingly, the reliability of the ferroelectric film can be improved.

Also, since the ferroelectric material is represented by the general formula (2), $(Bi_{4-x+y}A_xTi_3O_{12})_z+(DBi_2E_2O_9)_{1-z}$, the ferroelectric material has a superlattice structure in which $(DBi_2E_2O_9)$ operable at a lower voltage than $(Bi_{4-x}A_xTi_3O_{12})$ is substituted for part of $(Bi_{4-x}A_xTi_3O_{12})$. Therefore, a Ti atom included in $(Bi_{4-x}A_xTi_3O_{12})$ is substituted with an element E of the general formula having a smaller interatomic distance to an O atom than the Ti atom, so that a low-voltage operation of the ferroelectric film can be realized.

The third ferroelectric film of this invention is made from a ferroelectric material represented by a general formula (3), $Bi_{4-x+y-r}A_xD_rTi_{3-s}E_sO_{12}$, wherein A is an element selected from the group consisting of La, Pr, Nd, Sm, Eu, Gd, Tb, Dy, Ho, Er, Tm, Yb, Lu and V; D is an element selected from the group consisting of Sr, Ba, Ca, Cd, Pb and La; E is an element selected from the group consisting of Ta, Hf, W, Nb, Zr and Cr; and $0≦x≦2$, $0<y≦(4−x)×0.1$, $0<x+r≦2$, $0≦r≦0.5$ and $0≦s≦0.5$.

In the third ferroelectric film of the invention, since Bi is included by an excessive amount corresponding to a composition ratio y (y>0) of the general formula (3), even though Bi escapes from the crystal structure with the elapse of time, the excessive Bi enters a portion from which Bi has escaped, and therefore, the characteristic of the ferroelectric film is never degraded. Also, the Bi excessive content y satisfies a relationship of y≦(4−x)×0.1, a leakage current flowing due to deposition of bismuth on the ferroelectric film can be prevented. Accordingly, the reliability of the ferroelectric film can be improved.

Also, since the ferroelectric material is represented by the general formula (3), $Bi_{4-x+y-r}A_xD_rTi_{3-s}E_sO_{12}$, a Ti atom included in $Bi_{4-x+y}A_xTi_3O_{12}$ is substituted with an element E of the general formula (3), namely, an element having a smaller interatomic distance to an O atom than the Ti atom, so that the low-voltage operation of the ferroelectric film can be realized.

The first semiconductor device of this invention includes a ferroelectric film; and an electrode provided in contact with at least one face of the ferroelectric film, and the ferroelectric film is made from a ferroelectric material represented by a general formula (1), $Bi_{4-x+y}A_xTi_3O_{12}$, wherein A is an element selected from the group consisting of La, Pr, Nd, Sm, Eu, Gd, Tb, Dy, Ho, Er, Tm, Yb, Lu and V; and $0≦x≦2$ and $0<y≦(4−x)×0.1$.

In the first semiconductor device of the invention, since Bi is included by an excessive amount corresponding to a composition ratio y (y>0) of the general formula (1), even though Bi escapes from the crystal structure with the elapse of time, the excessive Bi enters a portion from which Bi has escaped, and therefore, the characteristic of the ferroelectric film is never degraded. Also, the Bi excessive content y satisfies a relationship of y≦(4−x)×0.1, a leakage current flowing due to deposition of bismuth on the ferroelectric film can be prevented. Accordingly, the reliability of the semiconductor device can be improved.

Preferably, in the first semiconductor device of the invention, $(4−x)×0.02≦y≦(4−x)×0.06$ in the general formula (1).

Thus, the initial polarization value of the ferroelectric film can be 20 $\mu C/cm^2$ or more, and hence, the reliability of the ferroelectric film, namely, the reliability of the semiconductor device, can be improved.

Preferably, in the first semiconductor device of the invention, A is La and $0.65≦x≦0.85$ in the general formula (1).

Thus, the initial polarization value of the ferroelectric film can be 20 $\mu C/cm^2$ or more, and hence, the reliability of the ferroelectric film, namely, the reliability of the semiconductor device, can be improved.

The second semiconductor device of this invention includes a ferroelectric film; and an electrode provided in contact with at least one face of the ferroelectric film, and the ferroelectric film is made from a ferroelectric material represented by a general formula (2), $(Bi_{4-x+y}A_xTi_3O_{12})_z+(DBi_2E_2O_9)_{1-z}$, wherein A is an element selected from the group consisting of La, Pr, Nd, Sm, Eu, Gd, Tb, Dy, Ho, Er, Tm, Yb, Lu and V; D is an element selected from the group consisting of Sr, Ba, Ca, Bi, Cd, Pd and La; E is an element selected from the group consisting of Ti, Ta, Hf, W, Nb, Zr and Cr; and $0≦x≦2$, $0<y≦(4−x)×0.1$ and $0.5<z<1$.

Since the second semiconductor device of the invention uses the second ferroelectric film of the invention, the reliability of the ferroelectric film, namely, the reliability of the semiconductor device, can be improved and a low-voltage operating characteristic can be realized.

The third semiconductor device of this invention includes a ferroelectric film; and an electrode provided in contact with at least one face of the ferroelectric film, and the ferroelectric film is made from a ferroelectric material represented by a general formula (3), $Bi_{4-x+y-r}A_xD_rTi_{3-s}E_sO_{12}$, wherein A is an element selected from the group consisting of La, Pr, Nd, Sm, Eu, Gd, Tb, Dy, Ho, Er, Tm, Yb, Lu and V; D is an element selected from the group consisting of Sr, Ba, Ca, Cd, Pb and La; E is an element selected from the group consisting of Ta, Hf, W, Nb, Zr and Cr; and $0≦x≦2$, $0<y≦(4−x)×0.1$, $0<x+r≦2$, $0≦r≦0.5$ and $0≦s≦0.5$.

Since the third semiconductor device of the invention uses the third ferroelectric film of the invention, the reliability of the ferroelectric film, namely, the reliability of the semiconductor device, can be improved and the low-voltage operating characteristic can be realized.

In any of the first through third semiconductor devices of the invention, the electrode is preferably made from at least one of iridium and iridium oxide.

Thus, there is no need to provide a complicated oxygen barrier layer, and therefore, a ferroelectric capacitor can be downsized and capacitor fabrication process can be simplified because the electrode structure can be simplified

DETAILED DESCRIPTION OF THE INVENTION

A ferroelectric film according to each embodiment of the invention is usable in any of a variety of semiconductor devices such as a ferroelectric capacitor, an MFS transistor, an MFIS transistor and an MFMIS transistor. Now, examples of the semiconductor devices that can use the ferroelectric film of each embodiment will be described with reference to FIGS. 1(a) and 1(b).

Figure 1A:
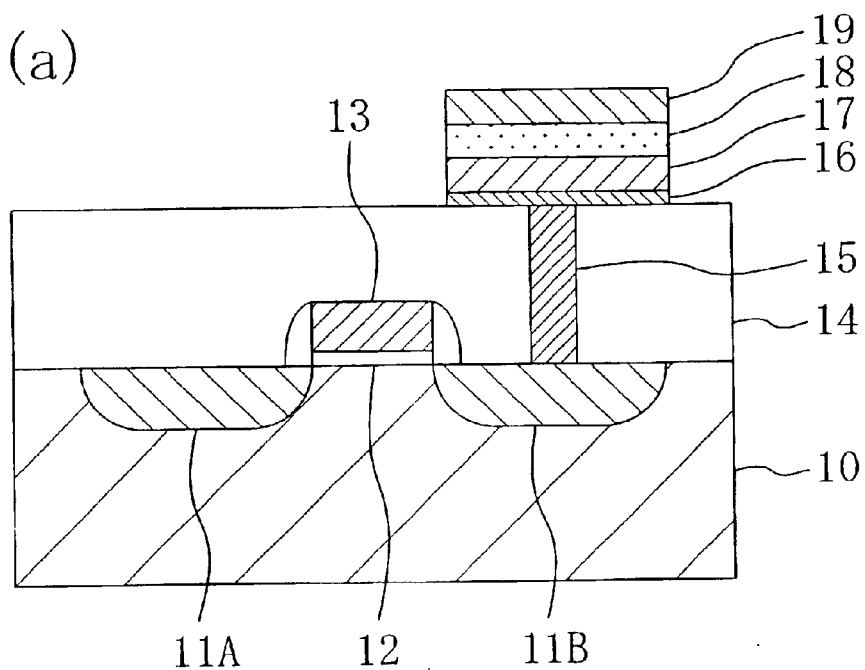
FIG. 1(a) is a cross-sectional view of a first semiconductor device including a ferroelectric film according to each embodiment of the invention and FIG. 1(b) is a cross-sectional view of a second semiconductor device including the ferroelectric film according to each embodiment of the invention.

FIG. 1(a) shows the cross-sectional structure of a first semiconductor device. As shown in FIG. 1(a), a source region 11A and a drain region 11B are formed in surface portions of a semiconductor substrate 10, and a gate electrode 13 is formed in a region between the source region 11A and the drain region 11B on the semiconductor substrate 10 with a gate insulating film 12 sandwiched therebetween. The source region 11A, the drain region 11B and the gate electrode 13 together construct an field effect transistor.

An insulating film 14 is deposited on the semiconductor substrate 10 so as to cover the field effect transistor, and a contact plug 15 is buried in the insulating film 14.

On the insulating film 14, an adhesion layer 16, a first electrode 17 made from at least one of iridium and iridium oxide, a capacitor dielectric film 18 made from a ferroelectric film and a second electrode 19 made from platinum are successively formed so as to be connected to the contact plug 15. The adhesion layer 16, the first electrode 17, the capacitor dielectric film 18 and the second electrode 19 together construct a ferroelectric capacitor.

In the first semiconductor device, the first electrode 17 connected to the contact plug 15 through the adhesion layer 16 is made from at least one of iridium and iridium oxide, which has a good oxygen barrier property, and the capacitor dielectric film 18 is made from a ferroelectric film (described in detail later) with a good oxygen barrier property. Therefore, there is no need to provide a conventional oxygen barrier layer between the adhesion layer 16 and the first electrode 17, and merely the adhesion layer 16 and the first electrode 17 are present between the insulting film 14 and the capacitor dielectric film 18. As a result, the distance between the insulating film 14 and the capacitor dielectric film 18 can be reduced, so as not only to downsize the ferroelectric capacitor but also to simplify patterning process.

Figure 1B:
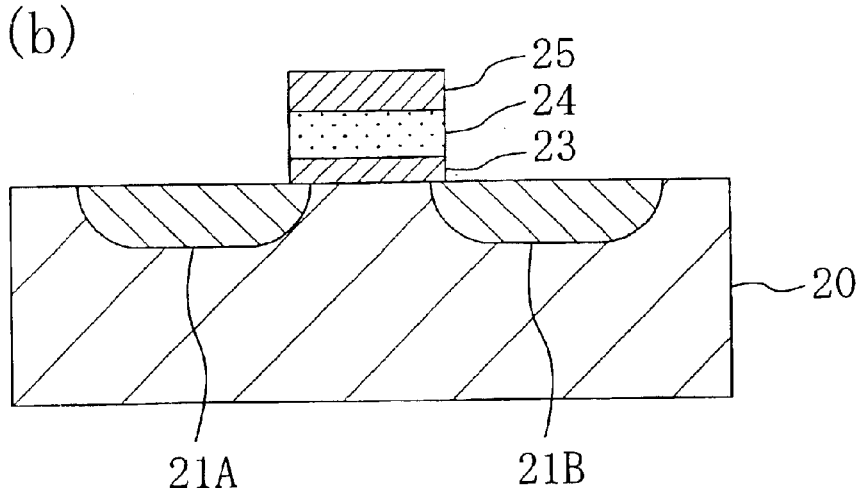

FIG. 1(b) shows the cross-sectional structure of a second semiconductor device. As shown in FIG. 1(b), a source region 21A and a drain region 21B are formed in surface portions of a semiconductor substrate 20. A silicon oxide film 23, a ferroelectric film 24 and a gate electrode 25 are successively formed in a region between the source region 21A and the drain region 21B on the semiconductor substrate 20. The source region 21A, the drain region 21B, the silicon oxide film 23, the ferroelectric film 24 and the gate electrode 25 together construct an MFIS transistor.

Embodiment 1

A first ferroelectric material used for forming a ferroelectric film according to Embodiment 1 will now be described with reference to FIGS. 2 through 6.

The first ferroelectric material used for forming the ferroelectric film of Embodiment 1 is represented by a general formula (1), $Bi_{4-x+y}A_xTi_3O_{12}$, wherein A is a nonvolatile element selected from the group consisting of La, Pr, Nd, Sm, Eu, Gd, Tb, Dy, Ho, Er, Tm, Yb, Lu and V.

Figure 2:
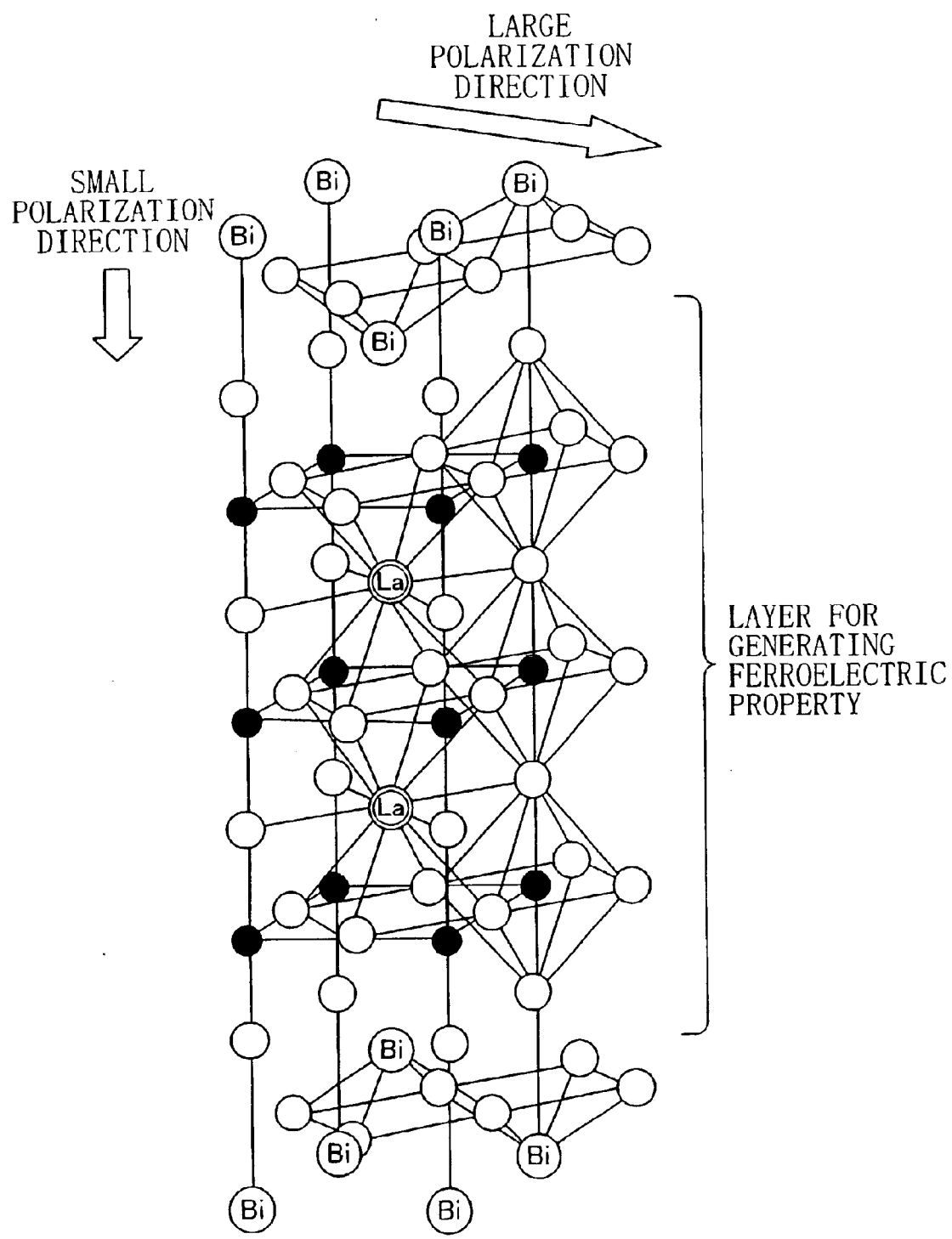
FIG. 2 is a schematic diagram for showing the crystal structure of a ferroelectric film according to Embodiment 1 of the invention.

FIG. 2 shows the crystal structure of a ferroelectric film made from the first ferroelectric material represented by the general formula (1), $Bi_{4-x+y}A_xTi_3O_{12}$, wherein A is La. In FIG. 2, La (lanthanum) enclosed with ⊙ is an element that constitutes a perovskite structure and largely affects the characteristic of the ferroelectric film; Bi (bismuth) enclosed with ○ is an element that is positioned in the vicinity of the perovskite structure and does not largely affect the characteristic of the ferroelectric film; a white circle indicates O (oxygen) and a black circle indicates Ti (titanium).

Although A of the general formula (1) may be any of La, Pr, Nd, Sm, Eu, Gd, Tb, Dy, Ho, Er, Tm, Yb, Lu and V, A is particularly preferably La.

The reason is as follows: Among the elements usable as A in the general formula (1), La is the most easily substituted with Bi, so as to substitute a large amount of Bi for stable La. In other words, La is good at a Bi substituting property.

As a characteristic of Embodiment 1, x and y of the general formula (1) satisfy the relationships of $0 \leq x \leq 2$ and $0 < y \leq (4-x) \times 0.1$.

As is understood from the general formula (1), when part of bismuth (Bi) is substituted for the nonvolatile element (A), the amount of non-substituted bismuth remaining without being substituted corresponds to (4−x+y), which is in excessive of the ordinary non-substituted bismuth content 4−x by an amount y (y>0).

Therefore, when bismuth escapes from the crystal structure with the elapse of time, the excessive bismuth enters a portion from which bismuth has escaped, so as to offset bismuth defect. Accordingly, even through bismuth escapes from the crystal structure, the crystal structure of the ferroelectric film can keep its state attained before the escape of bismuth, and therefore, the characteristic of the ferroelectric film is never degraded.

Figure 3:
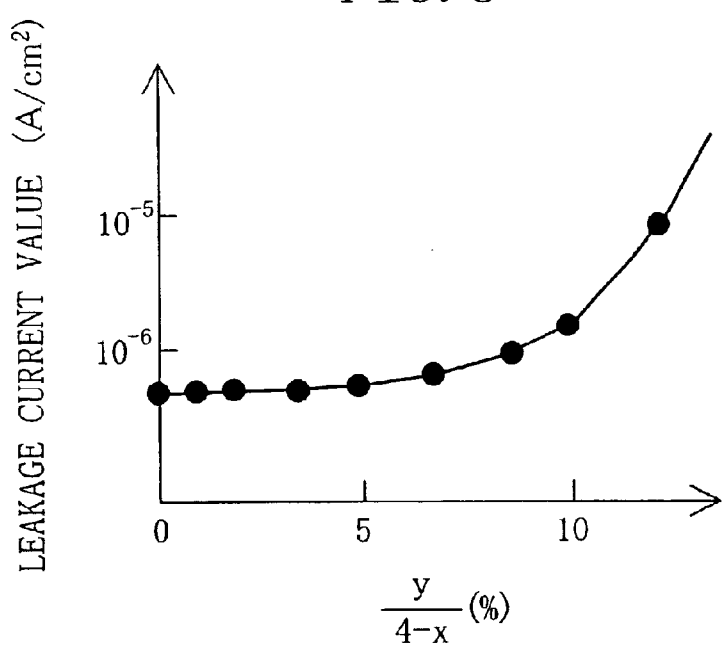
FIG. 3 is a graph for showing the relationship between a leakage current value and a ratio y/(4−x) of a Bi excessive content in a first ferroelectric material, $Bi_{3.25+y}La_{0.75}Ti_3O_{12}$ used for forming the ferroelectric film of Embodiment 1 of the invention.

FIG. 3 shows the relationship, obtained in a ferroelectric material represented by the general formula (1), wherein A is lanthanum and x is 0.75, namely, $Bi_{3.25+y}La_{0.75}Ti_3O_{12}$, between a ratio y/(4−x) (unit: %) of the bismuth excessive content y to the ordinary non-substituted bismuth content 4−x and a leakage current value (unit: $A/cm^2$). It is understood from FIG. 3 that when the ratio of the bismuth excessive content y to the ordinary non-substituted bismuth content 4−x exceeds 10%, the leakage current abruptly increases.

Accordingly, the bismuth excessive content y should be 10% or less of the ordinary non-substituted bismuth content 4−x. Thus, the leakage current flowing due to deposition of bismuth on the surface of the ferroelectric film can be avoided.

Figure 4:
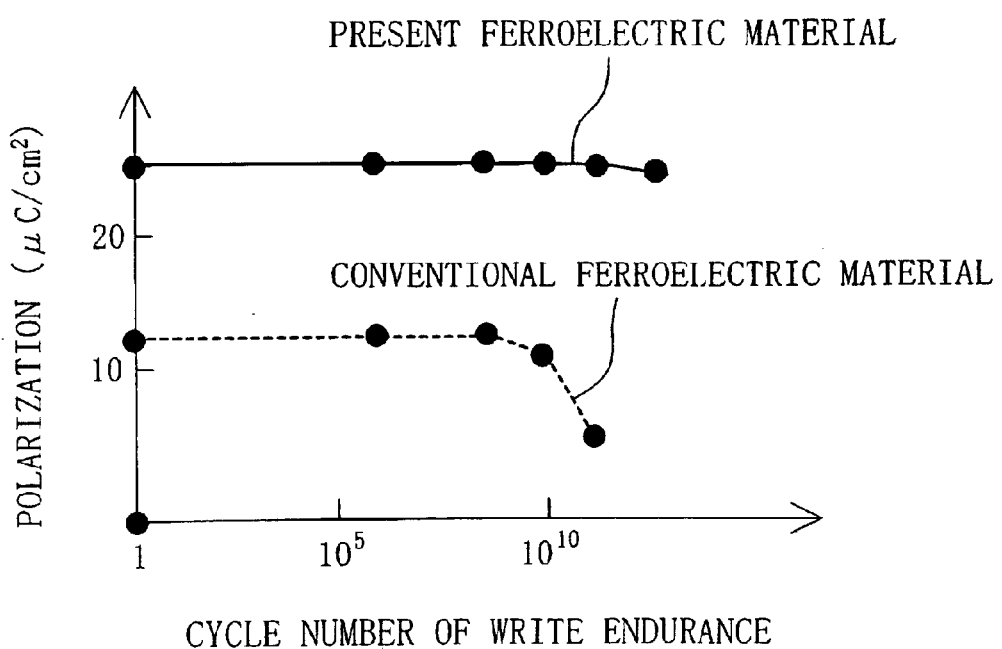
FIG. 4 is a graph for showing the relationship between the cycle number of write endurance and a polarization value obtained by using a first ferroelectric material, $Bi_{3.41}La_{0.75}Ti_3O_{12}$ for forming the ferroelectric film of Embodiment 1 of the invention.

FIG. 4 shows the relationship, obtained in a ferroelectric material represented by the general formula (1), wherein A is lanthanum, x is 0.75 and y is 0.16, namely, $Bi_{3.41}La_{0.75}Ti_3O_{12}$, between the cycle number of write endurance and the polarization value ($\mu C/cm^2$). It is understood that if the initial polarization value is 20 $\mu C/cm^2$ or more, the polarization value obtained when the cycle number of write endurance exceeds $10^{10}$ is 20 $\mu C/cm^2$ or more. Thus, the reliability is improved.

Figure 5:
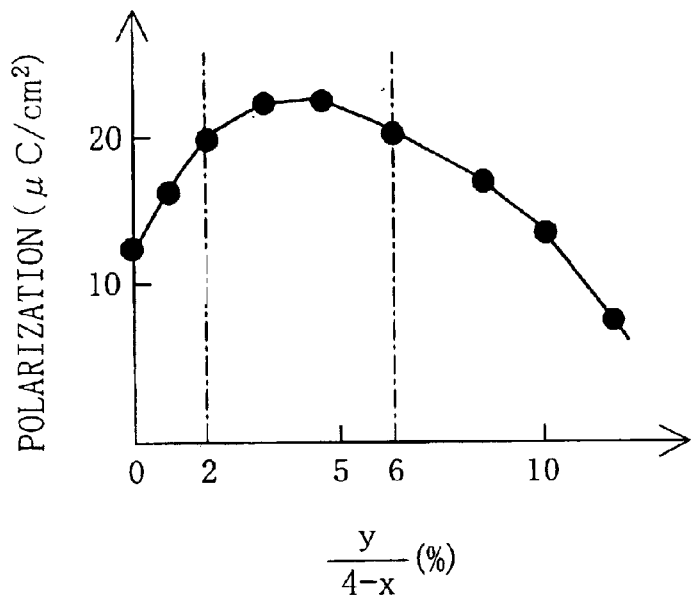
FIG. 5 is a graph for showing the relationship between the Bi excessive content in the first ferroelectric material, $Bi_{3.25+y}La_{0.75}Ti_3O_{12}$ used for forming the ferroelectric film of Embodiment 1 and an initial polarization value of the ferroelectric film.

FIG. 5 shows the relationship, obtained in a ferroelectric material represented by the general formula (1), wherein A is lanthanum and x is 0.75, namely, $Bi_{3.25+y}La_{0.75}Ti_3O_{12}$, between the ratio y/(4−x) (unit: %) of the bismuth excessive content y to the ordinary non-substituted bismuth content 4−x and the initial polarization value (unit: $\mu C/cm^2$) of the ferroelectric film.

It is understood from FIG. 5 that when the value of the ratio y/(4−x) is not less than 2% and not more than 6%, namely, when y of the general formula (1) satisfies a relationship of (4−x)×0.02≦y≦(4−x)×0.06, the initial polarization value of the ferroelectric film is 20 $\mu C/cm^2$ or more. Thus, the reliability of the ferroelectric film is improved.

Figure 6:
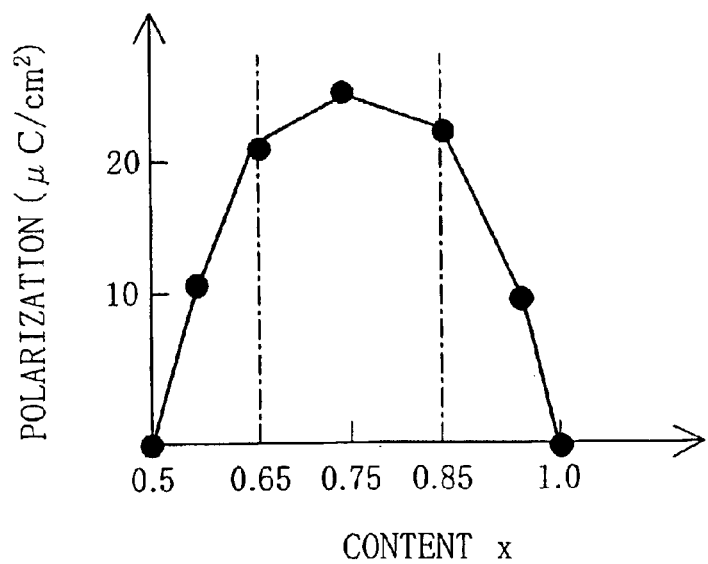
FIG. 6 is a graph for showing the relationship between a La content in a first ferroelectric material, $Bi_{(4-x)\times1.05}La_xTi_3O_{12}$ used for forming the ferroelectric film of Embodiment 1 of the invention and the initial polarization value of the ferroelectric film.

Since La is good at the Bi substituting property as described above, A of the general formula (1) is preferably La, and the content of La is preferably in the following range:

FIG. 6 shows the relationship, obtained by using the first ferroelectric material, $Bi_{(4-x)\times 1.05}La_xTi_3O_{12}$, between the La content x and the initial polarization value (unit: $\mu C/cm^2$) of the ferroelectric film. It is understood from FIG. 6 that when the content x is not less than 0.65 and not more than 0.85, the initial polarization value is 20 $\mu C/cm_2$ or more.

Accordingly, it is found that when x of the general formula (1) satisfies a relationship of 0.65≦x≦0.85, the reliability of the ferroelectric film can be improved.

Embodiment 2

Second and third ferroelectric materials used for forming a ferroelectric film according to Embodiment 2 of the invention will now be described with reference to FIGS. 7 through 13.

The second ferroelectric material is represented by a general formula (2), $(Bi_{4-x+y}A_xTi_3O_{12})_z+(DBi_2E_2O_9)_{1-z}$, wherein A is an element selected from the group consisting of La, Pr, Nd, Sm, Eu, Gd, Tb, Dy, Ho, Er, Tm, Yb, Lu and V; D is an element selected from the group consisting of Sr, Ba, Ca, Bi, Cd, Pb and La; E is an element selected from the group consisting of Ti, Ta, Hf, W, Nb, Zr and Cr; and 0≦x≦2, 0<y≦(4−x)×0.1 and 0.5<z<1.

The third ferroelectric material is represented by a general formula (3), $Bi_{4-x+y-r}A_xD_rTi_{3-s}E_sO_{12}$, wherein A is an element selected from the group consisting of La, Pr, Nd, Sm, Eu, Gd, Tb, Dy, Ho, Er, Tm, Yb, Lu and V; D is an element selected from the group consisting of Sr, Ba, Ca, Cd, Pb and La; E is an element selected from the group consisting of Ta, Hf, W, Nb, Zr and Cr; and 0≦x≦2, 0<y≦(4−x)×0.1, 0<x+r≦2, 0≦r≦2, and 0≦s<3.

In this case, A of the general formula (2) or (3) representing the second or third ferroelectric material is particularly preferably La. This is because La is the most easily substituted with Bi among the elements usable as A of the general formula (2) or (3) so as to substitute a large amount of Bi for stable La. In other words, La is good at the Bi substituting property.

Also, D of the general formula (2) or (3) representing the second or third ferroelectric material is particularly preferably Ba or Ca. This is because Ba and Ca have low melting points, and hence, the crystallization temperature minimally increases.

Also, E of the general formula (2) or (3) representing the second or third ferroelectric material is particularly preferably Ta or Nb. This is because Ta or Nb has an interatomic distance to an O atom smaller than that of Ti and is stable in charge.

Now, the reason why x and y of the general formula (2) or (3) representing the second or third ferroelectric material should satisfy relationships of 0≦x≦2 and 0<y≦(4−x)×0.1 will be described.

Figure 7:
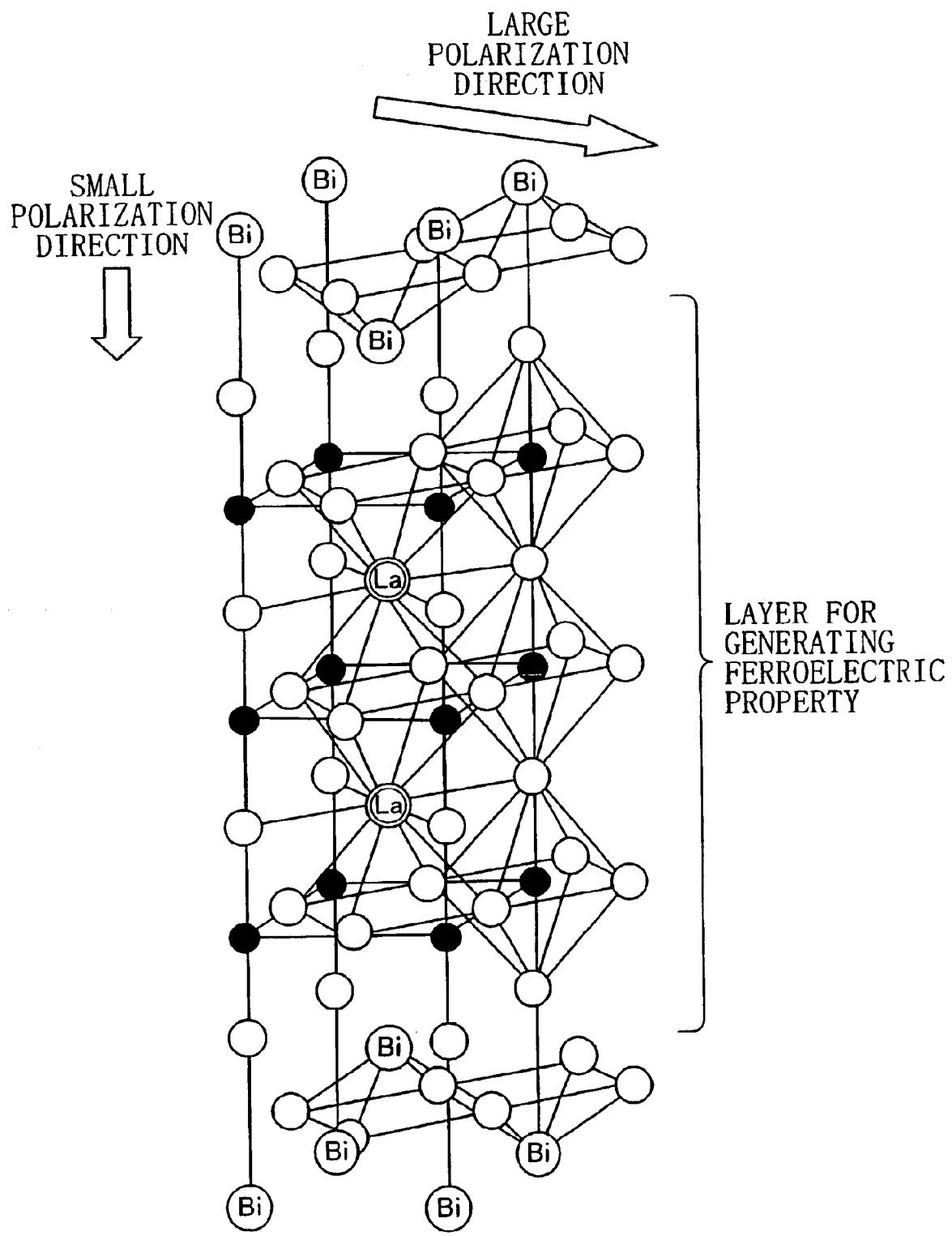
FIG. 7 is a schematic diagram for showing the crystal structure of a ferroelectric film according to Embodiment 2 of the invention.

FIG. 7 shows the crystal structure of a ferroelectric film made from the ferroelectric material represented by the general formula (1), $Bi_{4-x+y}A_xTi_3O_{12}$, wherein A is La. In FIG. 7, La (lanthanum) enclosed with ⊙ indicates an element that constitutes a perovskite structure and largely affects the characteristic of the ferroelectric film; Bi (bismuth) enclosed with ○ indicates an element that is positioned in the vicinity of the perovskite structure and does not largely affect the characteristic of the ferroelectric film; and a white circle indicates O (oxygen) and a black circle indicates Ti (titanium).

As is understood from the general formula (1), $Bi_{4-x+y}A_xTi_3O_{12}$, when part of bismuth (Bi) is substituted for the nonvolatile element A, the amount of non-substituted bismuth remaining without being substituted corresponds to (4−x+y), which is in excessive of the ordinary non-substituted bismuth content 4−x by the amount y (y>0).

Therefore, when bismuth escapes from the crystal structure with the elapse of time, the excessive bismuth enters a portion from which bismuth has been escaped. Accordingly, even through bismuth escapes from the crystal structure, the crystal structure of the ferroelectric film can keep its state attained before the escape of bismuth, and hence, the characteristic of the ferroelectric film is never degraded.

Figure 8:
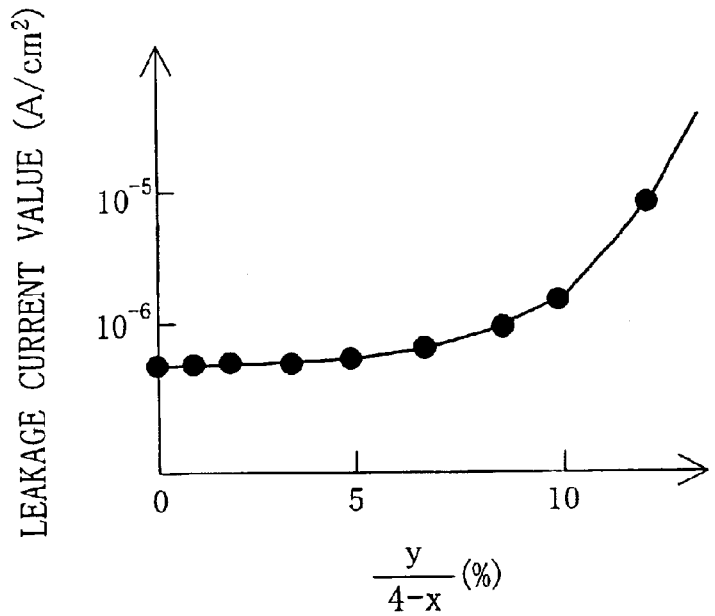
FIG. 8 is a graph for showing the relationship between a leakage current value and a ratio y/(4-x) of a Bi excessive content in a second or third ferroelectric material, $Bi_{3.25+y}La_{0.75}Ti_3O_{12}$ used for forming the ferroelectric film of Embodiment 2 of the invention.

FIG. 8 shows the relationship, obtained in a ferroelectric material represented by the general formula (1), $Bi_{4-x+y}A_xTi_3O_{12}$, wherein A is lanthanum and x is 0.75, namely, $Bi_{3.25+y}La_{0.75}Ti_3O_{12}$, between the ratio y/(4−x) (unit: %) of the bismuth excessive content y to the ordinary non-substituted bismuth content 4−x and a leakage current value (unit: $A/cm^2$).

It is understood from FIG. 8 that when the ratio of the bismuth excessive content y to the ordinary non-substituted bismuth content 4−x exceeds 10%, the leakage current abruptly increases.

Accordingly, the bismuth excessive content y should be 10% or less of the ordinary non-substituted bismuth content 4−x. Thus, the leakage current flowing due to deposition of bismuth on the surface of the ferroelectric film can be avoided.

Next, the characteristics of the second or third ferroelectric material having a crystal structure in which the element E is substituted for part of Ti in the general formula, $Bi_{4-x}A_xTi_3O_{12}$ will be described.

Figure 9:
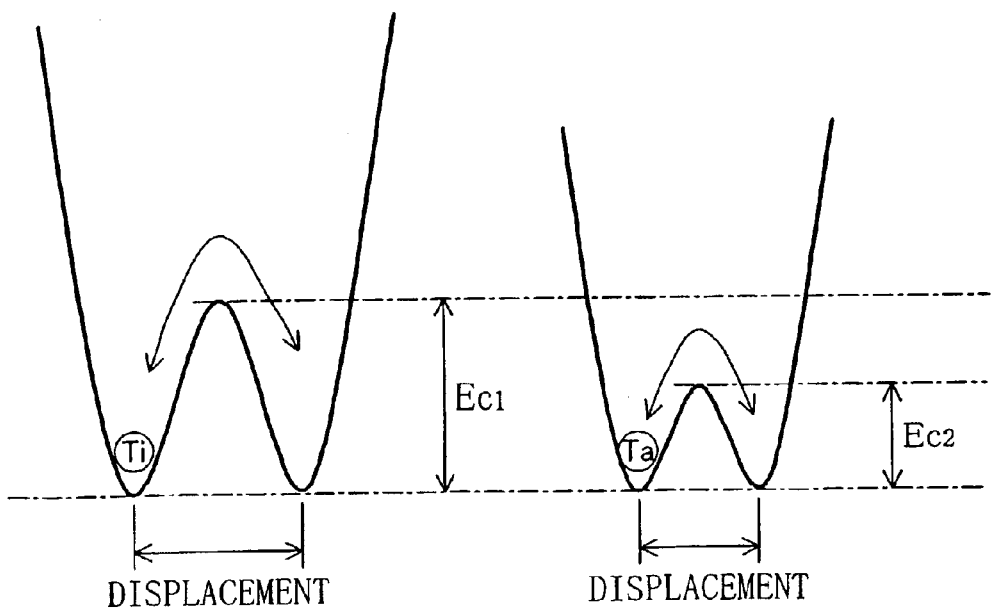
FIG. 9 is a diagram for showing potential energy obtained when the central atom of an octahedron constituting the crystal structure of the second or third ferroelectric material used for forming the ferroelectric film of Embodiment 2 of the invention is changed from Ti to Ta.

FIG. 9 shows potential energy obtained when the central atom of an octahedron constituting the crystal structure of the second or third ferroelectric material is changed from Ti to Ta. When the central atom of the octahedron is changed from Ti to Ta, displacement is reduced, so that the operation voltage is lowered from a voltage Ec1 to a voltage Ec2. In other words, the operation voltage is lowered by a voltage (Ec1−Ec2).

Although FIG. 9 shows the change of the operation voltage caused when the central atom of the octahedron is changed from Ti to Ta, the operation voltage is lowered also when the element E is substituted for part of Ti, that is, the central atom of the octahedron, in the general formula (2) or (3) representing the second or third ferroelectric material.

Figure 10:
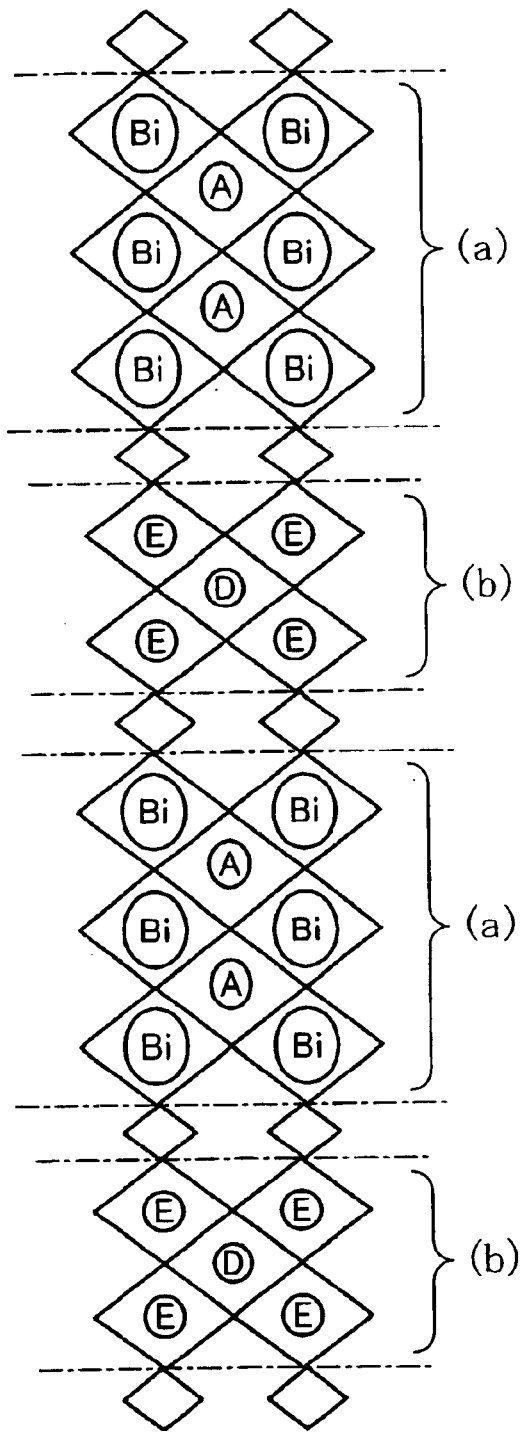
FIG. 10 is a schematic diagram of the crystal structure of the second ferroelectric material used for forming the ferroelectric film according to Embodiment 2 of the invention.

FIG. 10 schematically shows the crystal structure of the second ferroelectric material, and the second ferroelectric material has a superlattice structure in which a structure indicated as (b) in FIG. 10 is substituted for part of a structure represented by general formula, $Bi_{4-x}A_xTi_3O_{12}$ (indicated as (a) in FIG. 10), namely, it has a structure in which the structure (a) and the structure (b) are alternately arranged.

In the structure (b) of FIG. 10, the atom positioned at the center of the octahedron corresponds to the element E, and the interatomic distance between the element E and O is smaller than that between Ti and O. Therefore, the polarization is inverted at a lower voltage in the structure (b) than in the structure (a). When the polarization of the structure (b) is inverted, the polarization of the structure (a) is also inverted, and therefore, the polarization of the ferroelectric film made from the second ferroelectric material is inverted. Accordingly, the ferroelectric film made from the second ferroelectric material is operated at a lower voltage than a ferroelectric film made from a conventional ferroelectric material.

Figure 11:
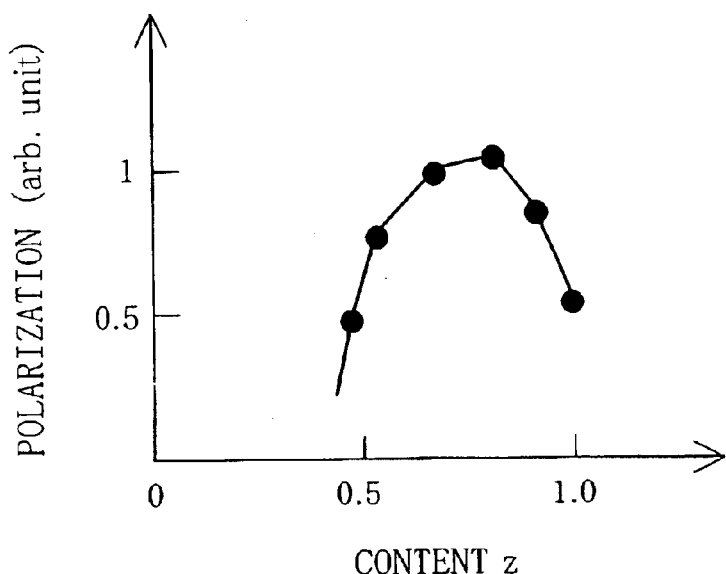
FIG. 11 is a graph for showing the relationship between polarization and a composition ratio z of $(Bi_{4-x+y}A_xTi_3O_{12})$ in a general formula (2), $(Bi_{4-x+y}A_xTi_3O_{12})_z+(DBi_2E_2O_9)_{1-z}$, representing the second ferroelectric material used for forming the ferroelectric film of Embodiment 2 of the invention.

FIG. 11 shows the relationship between the polarization and a composition ratio z of $(Bi_{4-x+y}A_xTi_3O_{12})$ in the general formula (2), $(Bi_{4-x+y}A_xTi_3O_{12})_z+(DBi_2E_2O_9)_{1-z}$ representing the second ferroelectric material. It is understood from FIG. 11 that when 0.5<z<1.0, the ferroelectric film can exhibit a good polarization characteristic.

Figure 12:
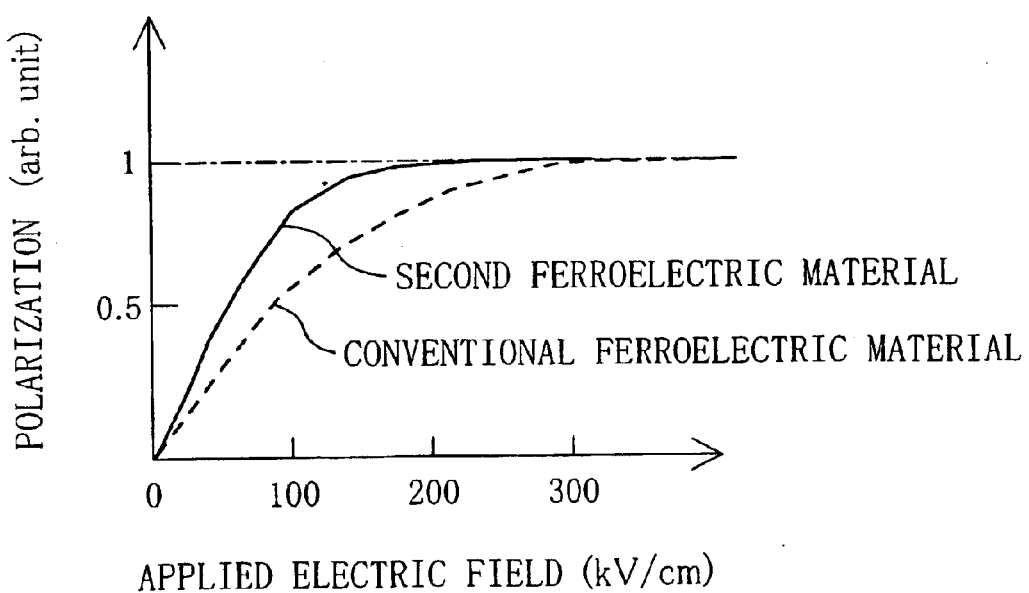
FIG. 12 is a graph for showing the relationship between the polarization value and a voltage applied to the ferroelectric film of Embodiment 2 of the invention made from the second ferroelectric material.

FIG. 12 shows the relationship between the polarization value and an electric field applied to the ferroelectric film made from the second ferroelectric material. In FIG. 12, a broken line indicates the relationship obtained in a conventional ferroelectric material (wherein z=1), and a solid line indicates the relationship obtained in the second ferroelectric material (wherein z=0.8). As is understood from FIG. 12, the polarization value can be largely improved by using the second ferroelectric material as compared with that attained by using the conventional ferroelectric material.

The third ferroelectric material is obtained by substituting part of Ti atoms included in the conventional crystal structure represented by the general formula, $Bi_{4-x}A_xTi_3O_{12}$ with the element E of the general formula (3) representing the third ferroelectric material, and has a crystal structure in which the structure (a) and the structure (b) of FIG. 10 are not alternately arranged. Merely when the element E is simply substituted for a Ti atom, the principal of conversion of charge may fail, and therefore, in the third ferroelectric material, the element D is substituted for part of the element A of the general formula, $Bi_{4-x}A_xTi_3O_{12}$.

In the third ferroelectric material, the element E of the general formula (3) representing the third ferroelectric material is substituted for part of Ti atoms included in the crystal structure represented by the general formula, $Bi_{4-x}A_xTi_3O_{12}$, and therefore, the ferroelectric film made from the third ferroelectric material is operated at a lower voltage than a ferroelectric film made from a conventional ferroelectric material.

Figure 13:
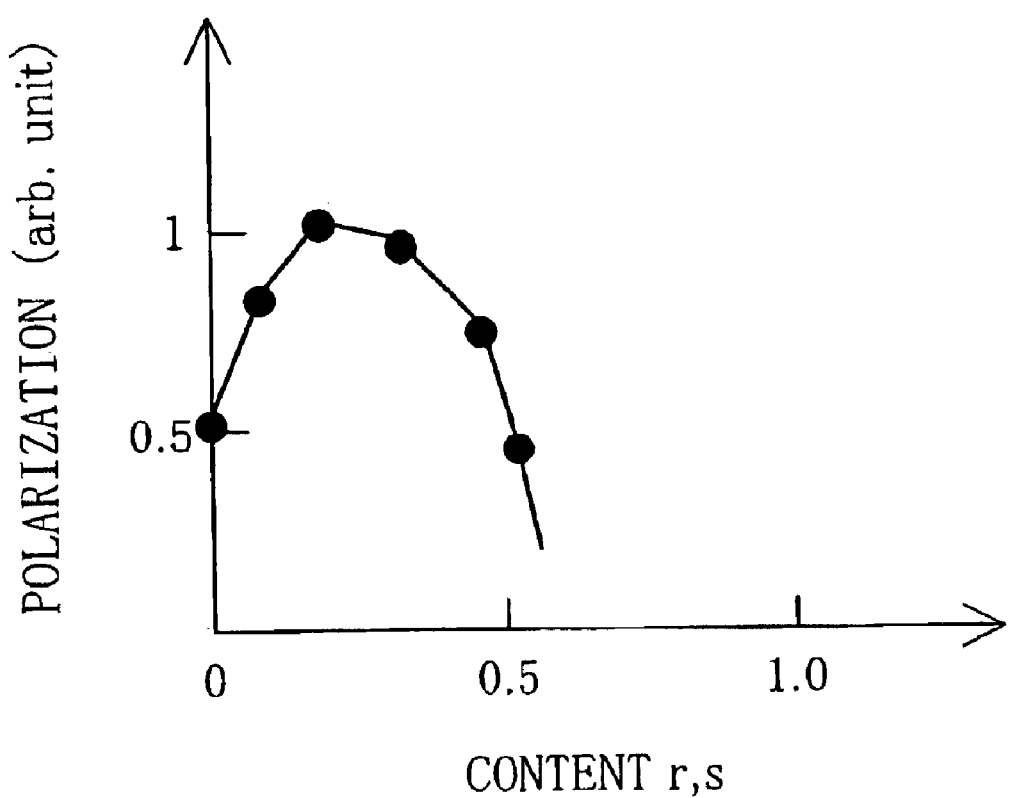
FIG. 13 is a graph for showing the relationship between the polarization value and a composition ratio r of an element D and a composition ratio s of an element E in a general formula (3), $Bi_{4-x+y-r}A_xD_rTi_{3-s}E_sO_{12}$ representing the third ferroelectric material used for forming the ferroelectric film of Embodiment 2 of the invention.

FIG. 13 shows the relationship between the polarization value and composition ratios r and s of the elements D and E in the general formula (3) representing the third ferroelectric material, $(Bi_{4-x+y-r}A_xD_rTi_{3-s}E_sO_{12})$. It is understood from FIG. 13 that when $0 \leq r \leq 0.5$ and $0 \leq s \leq 0.5$, the ferroelectric film can exhibit a good polarization characteristic.

What is claimed is:

1. A ferroelectric film made from a ferroelectric material represented by a general formula, $Bi_{4-x+y}A_xTi_3O_{12}$, wherein A is an element selected from the group consisting of La, Pr, Nd, Sm, Eu, Gd, Tb, Dy, Ho, Er, Tm, Yb, Lu and V; and $0 \leq x \leq 2$ and $0 < y \leq (4-x) \times 0.1$.

2. The ferroelectric film of claim 1,
wherein $(4-x) \times 0.02 \leq y \leq (4-x) \times 0.06$ in said general formula.

3. The ferroelectric film of claim 1,
wherein A is La and $0.65 \leq x \leq 0.85$ in said general formula.

4. A ferroelectric film made from a ferroelectric material represented by a general formula, $(Bi_{4-x+y}A_xTi_3O_{12})_z+(DBi_2E_2O_9)_{1-z}$, wherein A is an element selected from the group consisting of La, Pr, Nd, Sm, Eu, Gd, Tb, Dy, Ho, Er, Tm, Yb, Lu and V; D is an element selected from the group consisting of Sr, Ba, Ca, Bi, Cd, Pd and La; E is an element selected from the group consisting of Ti, Ta, Hf, W, Nb, Zr and Cr; and $0 \leq x \leq 2$, $0 < y \leq (4-x) \times 0.1$ and $0.5 < z < 1$.

5. A ferroelectric film made from a ferroelectric material represented by a general formula, $Bi_{4-x+y-r}A_xD_rTi_{3-s}E_sO_{12}$, wherein A is an element selected from the group consisting of La, Pr, Nd, Sm, Eu, Gd, Tb, Dy, Ho, Er, Tm, Yb, Lu and V; D is an element selected from the group consisting of Sr, Ba, Ca, Cd, Pb and La; E is an element selected from the group consisting of Ta, Hf, W, Nb, Zr and Cr; and $0 \leq x \leq 2$, $0 < y \leq (4-x) \times 0.1$, $0 < x+r \leq 2$, $0 \leq r \leq 0.5$ and $0 \leq s \leq 0.5$.

6. A semiconductor device comprising:
a ferroelectric film; and
an electrode provided in contact with at least one face of said ferroelectric film,
wherein said ferroelectric film is made from a ferroelectric material represented by a general formula, $Bi_{4-x+y}A_xTi_3O_{12}$, wherein A is an element selected from the group consisting of La, Pr, Nd, Sm, Eu, Gd, Tb, Dy, Ho, Er, Tm, Yb, Lu and V; and $0 \leq x \leq 2$ and $0 < y \leq (4-x) \times 0.1$.

7. The semiconductor device of claim 6,
wherein $(4-x) \times 0.02 \leq y \leq (4-x) \times 0.06$ in said general formula.

8. The semiconductor device of claim 6,
wherein A is La and $0.65 \leq x \leq 0.85$ in said general formula.

9. The semiconductor device of claim 6,
wherein said electrode is made from at least one of iridium and iridium oxide.

10. A semiconductor device comprising:

a ferroelectric film; and an electrode provided in contact with at least one face of said ferroelectric film, wherein said ferroelectric film is made from a ferroelectric material represented by a general formula, $(Bi_{4-x+y}A_xTi_3O_{12})_z + (DBi_2E_2O_9)_{1-z}$, wherein A is an element selected from the group consisting of La, Pr, Nd, Sm, Eu, Gd, Tb, Dy, Ho, Er, Tm, Yb, Lu and V; D is an element selected from the group consisting of Sr, Ba, Ca, Bi, Cd, Pd and La; E is an element selected from the group consisting of Ti, Ta, Hf, W, Nb, Zr and Cr; and $0 \leq x \leq 2$, $0 < y \leq (4-x) \times 0.1$ and $0.5 < z < 1$.

11. The semiconductor device of claim 10,
wherein said electrode is made from at least one of iridium and iridium oxide.

12. A semiconductor device comprising:

a ferroelectric film; and an electrode provided in contact with at least one face of said ferroelectric film, wherein said ferroelectric film is made from a ferroelectric material represented by a general formula, $Bi_{4-x+y-r}A_xD_rTi_{3-s}E_sO_{12}$, wherein A is an element selected from the group consisting of La, Pr, Nd, Sm, Eu, Gd, Tb, Dy, Ho, Er, Tm, Yb, Lu and V; D is an element selected from the group consisting of Sr, Ba, Ca, Cd, Pb and La; E is an element selected from the group consisting of Ta, Hf, W, Nb, Zr and Cr; and $0 \leq x \leq 2$, $0 < y \leq (4-x) \times 0.1$, $0 < x+r \leq 2$, $0 \leq r \leq 0.5$ and $0 \leq s \leq 0.5$.

13. The semiconductor device of claim 12,
wherein said electrode is made from at least one of iridium and iridium oxide.

* * * * *